(12) United States Patent
Zuo et al.

(10) Patent No.: US 10,998,385 B2
(45) Date of Patent: May 4, 2021

(54) DISPLAY ELEMENT, METHOD FOR FABRICATING THE SAME AND DISPLAY DEVICE

(71) Applicant: BOE Technology Group Co., Ltd., Beijing (CN)

(72) Inventors: Yueping Zuo, Beijing (CN); Shuai Zhang, Beijing (CN); Shantao Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/399,156

(22) Filed: Apr. 30, 2019

(65) Prior Publication Data

US 2020/0043992 A1     Feb. 6, 2020

(30) Foreign Application Priority Data

Aug. 3, 2018    (CN) .......................... 201810879276.X

(51) Int. Cl.
| | |
|---|---|
| H01L 27/32 | (2006.01) |
| H01L 51/52 | (2006.01) |
| G06K 9/00 | (2006.01) |
| H01L 51/56 | (2006.01) |

(52) U.S. Cl.
CPC ...... *H01L 27/3227* (2013.01); *G06K 9/00087* (2013.01); *H01L 27/3246* (2013.01); *H01L 27/3272* (2013.01); *H01L 51/5262* (2013.01); *H01L 51/56* (2013.01); *H01L 2227/323* (2013.01)

(58) Field of Classification Search
CPC ............ H01L 51/5262; H01L 27/3246; H01L 27/3227; H01L 27/3272
See application file for complete search history.

(56) References Cited

U.S. PATENT DOCUMENTS

2008/0203279 A1* 8/2008 Kobashi ................ G01J 1/4204
250/216
2015/0187980 A1* 7/2015 Yamamoto ........... H04N 5/2254
250/552

* cited by examiner

*Primary Examiner* — Dale E Page
*Assistant Examiner* — Wilner Jean Baptiste
(74) *Attorney, Agent, or Firm* — Arent Fox LLP; Michael Fainberg

(57) ABSTRACT

A display element, a method for fabricating the same, and a display device are provided. The display element includes: a blocking layer; a fingerprint sensor on one side of the blocking layer; a light-shielding layer on the side of the blocking layer away from the fingerprint sensor, wherein the light-shielding layer includes a first via-hole; a middle layer on the light-shielding layer; a pixel definition layer on the middle layer, wherein the pixel definition layer includes a second via-hole in which a cathode layer and a light-emitting layer are arranged; an antireflection coating on the pixel definition layer; and an anode layer on the light-emitting layer.

8 Claims, 1 Drawing Sheet

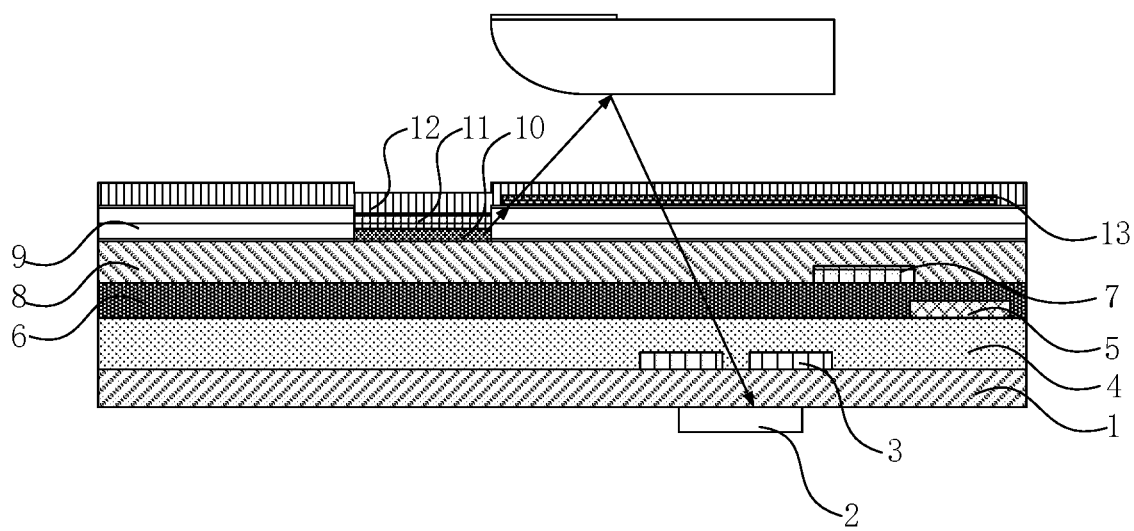

DISPLAY ELEMENT, METHOD FOR FABRICATING THE SAME AND DISPLAY DEVICE

CROSS-REFERENCES TO RELATED APPLICATION

This application claims priority to Chinese patent application No. 201810879276.X filed on Aug. 3, 2018, which is incorporated herein by reference in its entirety.

FIELD

The present disclosure relates to the field of display technologies, and particularly to a display element, a method for fabricating the same and a display device.

BACKGROUND

The fingerprint recognition and display element generally recognizes a fingerprint optically through aperture imaging, where light emitted from the display element is reflected by the fingerprint, and then aperture-imaged onto a fingerprint sensor. Particularly the light can be reflected by valleys and ridges of the fingerprint to and imaged onto the fingerprint sensor to thereby recognize the fingerprint.

SUMMARY

In one aspect, an embodiment of the disclosure provides a display element. The display element includes: a blocking layer; a fingerprint sensor on one side of the blocking layer; a light-shielding layer on a side of the blocking layer away from the fingerprint sensor, wherein the light-shielding layer includes a first via-hole, and an orthographic projection of the fingerprint sensor on the blocking layer lies within an orthographic projection of the light-shielding layer on the blocking layer; a middle layer on a side of the light-shielding layer away from the blocking layer; a pixel definition layer on a side of the middle layer away from the blocking layer, wherein the pixel definition layer includes a second via-hole in which a cathode layer on a side of the middle layer away from the blocking layer and a light-emitting layer on a side of the cathode away from the blocking layer are arranged; an antireflection coating on a side of the pixel definition layer away from the blocking layer; and an anode layer on a side of the light-emitting layer away from the blocking layer.

In some embodiments, at least a part of an orthographic projection of the antireflection coating on the blocking layer lies between an orthographic projection of the cathode layer on the blocking layer and the orthographic projection of the light-shielding layer on the blocking layer.

In some embodiments, the antireflection coating includes a plurality of sub-layers stacked in a direction from the fingerprint sensor to the blocking layer.

In some embodiments, the antireflection coating is made of a material at least including one of MgF, TiO, or SiO.

In some embodiments, a thickness of the antireflection coating is one fourth of the wavelength of light which is transmitted therethrough.

In some embodiments, the middle layer includes: a gate insulating layer on the side of the light-shielding layer away from the blocking layer; a gate on a side of the gate insulating layer away from the blocking layer; an interlayer insulating layer on a side of the gate away from the blocking layer; a source-drain electrode layer on a side of the interlayer insulating layer away from the blocking layer; and a planarization layer on a side of the source-drain electrode layer away from the blocking layer.

In another aspect, an embodiment of the disclosure further provides a display device including the display element according to any one of the technical solutions above.

In another aspect, an embodiment of the disclosure further provides a method for fabricating the display element above. The method includes: arranging a fingerprint on one side of a blocking layer; forming a light-shielding layer on a side of the blocking layer away from the fingerprint sensor, forming a first via-hole in the light-shielding layer by hole-etching, and patterning the light-shielding layer so that an orthographic projection of the fingerprint sensor on the blocking layer lies within an orthographic projection of the light-shielding layer on the blocking layer; forming a middle layer on the light-shielding layer; forming a pixel definition layer on the middle layer; depositing an antireflection coating on the pixel definition layer by physical vapor deposition or chemical vapor deposition, and patterning the antireflection coating; forming a second via-hole on the pixel definition layer by hole-etching; forming a cathode layer and a light-emitting layer in the second via-hole; and forming an anode layer on the light-emitting layer.

In some embodiments, the method further includes: forming a gate insulating layer on the light-shielding layer; forming a gate on the gate insulating layer; forming an interlayer insulating layer on the gate; forming a source-drain electrode layer on the interlayer insulating layer; and forming a planarization layer on the source-drain electrode layer.

BRIEF DESCRIPTION OF THE DRAWINGS

FIG. 1 is a schematic structural diagram of a display element according to an embodiment of the disclosure.

DETAILED DESCRIPTION

The technical solutions according to the embodiments of the disclosure will be described below clearly and fully with reference to the drawings in the embodiments of the disclosure. Apparently the embodiments to be described are only a part but all of the embodiments of the disclosure. Based upon the embodiments here of the disclosure, all of other embodiments which can occur to those ordinarily skilled in the art without any inventive effort shall come into the scope of the disclosure as claimed.

In the related art, the light reflected by the fingerprint can only be propagated to the fingerprint sensor by passing through a cathode, and in this process, the light reflected by the fingerprint may be somewhat lost. Further, the light transmitted from the display element and reflected by the cathode can also reach the fingerprint sensor as stray light, thus degrading the effect of recognizing the fingerprint.

In view of the problem above of a low success ratio of recognizing a fingerprint, it is common in the related art to block the reflect path of the stray light using a combination of metal wires, to thereby shield the stray light so as to improve the recognition success ratio. However in these methods, the recognition success ratio has been insignificantly improved, the design of a display circuit has remained sophisticated, and it has been difficult to apply them to a high-definition product.

Embodiments of the disclosure provide a display element, a method for fabricating the same and a display device, where an antireflection coating is arranged in the display element to thereby alleviate stray light from reaching a fingerprint sensor, and enhance the intensity of light reflected by a fingerprint so as to improve the precision of recognizing the fingerprint.

Referring to FIG. 1, an embodiment of the disclosure provides a display element. The display element includes: a blocking layer 1; a fingerprint sensor 2 on one side of the blocking layer 1; a light-shielding layer 3 on the side of the blocking layer 1 away from the fingerprint sensor 2, where the light-shielding layer 3 includes a first via-hole, and an orthographic projection of the fingerprint sensor 2 on the blocking layer 1 lies within an orthographic projection of the light-shielding layer 3 on the blocking layer 1; a middle layer on the side of the light-shielding layer 3 away from the blocking layer 1; a pixel definition layer 9 on the side of the middle layer away from the blocking layer 1, where the pixel definition layer 9 includes a second via-hole in which a cathode layer 10 on the side of the middle layer away from the blocking layer 1 and a light-emitting layer 11 on the side of the cathode 10 away from the blocking layer 1 are arranged; an antireflection coating 13 on the side of the pixel definition layer 9 away from the blocking layer 1; and an anode layer 12 on the side of the light-emitting layer 11 away from the blocking layer 1.

The display element above includes the blocking layer 1, the fingerprint sensor 2 formed on one side of the blocking layer 1, and the light-shielding layer 3, the middle layer, the pixel definition layer 9, and the antireflection coating 13 arranged successively on the side of the blocking layer away from the fingerprint sensor 2. The pixel definition layer 9 includes the second via-hole in which the cathode layer 10 and the light-emitting layer 11 are formed successively in the direction away from the blocking layer 1, and the anode layer 12 is formed on the side of the light-emitting layer 11 away from the blocking layer 1. In operation, the display element according to the embodiment of the disclosure emits light so that the light reaches a finger, and is reflected by a fingerprint on the finger, and the reflected light can be propagated to the fingerprint sensor 2 through the first via-hole of the light-emitting layer 3, and the fingerprint sensor 2 can recognize the fingerprint. In this process, a part of the light emitted by the light-emitting layer 11 is reflected by the cathode layer 10, and this reflected part of the light can be propagated to the antireflection coating 13, and exit the display element through the antireflection coating 13.

The antireflection coating 13 is additionally arranged in the display element according to the embodiment of the disclosure, and the stray light reflected by the cathode layer 10 can be transmitted through the antireflection coating 13. It shall be noted that while the fingerprint recognizing sensor is recognizing the fingerprint, on one hand, the stray light reflected by the cathode layer 10 can exit the display element through the antireflection coating, so the luminance of the display element can be improved to thereby improve the intensity of the light reaching the finger, and improve the intensity of the light reflected by the fingerprint so as to enhance the signal of the fingerprint sensor 2, and to improve the accuracy of recognizing the fingerprint; and on the other hand, the stray light, reflected by the cathode layer 10, reaching the fingerprint sensor 2 can be greatly alleviated due to the effect of the antireflection coating, to thereby alleviate the recognition of the fingerprint from being affected by the noisy stray light so as to improve the recognition success ratio. As can be apparent from the description, the accuracy of recognizing the fingerprint by the display element according to the embodiment of the disclosure will be high.

Accordingly the antireflection coating 13 is arranged in the display element above to thereby alleviate the stray light from reaching the fingerprint sensor 2, and enhance the intensity of the light reflected by the fingerprint, so as to improve the precision of recognizing the fingerprint.

Further to the technical solution above, in order to enable the stray light reflected by the cathode layer to be propagated to the antireflection coating as much as possible, in some embodiments, at least a part of an orthographic projection of the antireflection coating 13 on the blocking layer 1 lies between an orthographic projection of the cathode layer 10 on the blocking layer 1, and the orthographic projection of the light-shielding layer 3 on the blocking layer 1.

In some embodiments, in order to improve the effect of the antireflection, the antireflection coating 13 includes a plurality of sub-layers stacked in the direction from the fingerprint sensor 2 to the blocking layer 1.

It shall be noted that the plurality of sub-layers can enhance the antireflection effect of light at a plurality of wavelength, to thereby enhance the intensity of the light reflected by the fingerprint so as to improve the precision of recognizing the fingerprint.

Further to the technical solution above, in some embodiments, the antireflection coating is made of a material at least including one of MgF, TiO, or SiO.

Further to the technical solution above, in some embodiments, the thickness of the antireflection coating is one fourth of the wavelength of light which can be transmitted therethrough.

Further to the technical solution above, it shall be noted that the middle layer is the structure including various layers in the related art, and can be modified as needed, and in some embodiments, further referring to FIG. 1, the middle layer includes: a gate insulating layer 4 on the side of the light-shielding layer 3 away from the blocking layer 1; a gate 5 on the side of the gate insulating layer 4 away from the blocking layer 1; an interlayer insulating layer 6 on the side of the gate 5 away from the blocking layer 1; a source-drain electrode layer 7 on the side of the interlayer insulating layer 6 away from the blocking layer 1; and a planarization layer 8 on the side of the source-drain electrode layer 7 away from the blocking layer 1.

An embodiment of the disclosure further provides a display device including a plurality of display elements according to any one of the technical solutions above.

An embodiment of the disclosure further provides a method for fabricating the display element, where the method includes the following steps of: arranging the fingerprint 2 on one side of the blocking layer 1; forming the light-shielding layer 3 on the side of the blocking layer 1 away from the fingerprint sensor 2, forming the first via-hole in the light-shielding layer 3 by hole-etching, and patterning the light-shielding layer 3 so that the orthographic projection of the fingerprint sensor 2 on the blocking layer 1 lies within the orthographic projection of the light-shielding layer 3 on the blocking layer 1; forming the middle layer on the light-shielding layer 3; forming the pixel definition layer 9 on the middle layer; depositing an antireflection coating on the pixel definition layer 9 through physical vapor deposition or chemical vapor deposition, and patterning the antireflection coating 13; forming the second via-hole in the pixel definition layer 9 by hole-etching; forming the cathode layer 10 and the light-emitting layer 11 in the second via-hole; and forming the anode layer 12 on the light-emitting layer 11.

The display element fabricated using the method above includes the blocking layer 1, the fingerprint sensor 2 formed on one side of the blocking layer 1, and the light-shielding layer 3, the middle layer, the pixel definition layer 9, and the antireflection coating 13 arranged successively on the side of the blocking layer away from the fingerprint sensor 2, where the pixel definition layer 9 includes the second via-hole in which the cathode layer 10 and the light-emitting layer 11 are formed successively in the direction away from the blocking layer 1, and the anode layer 12 is formed on the side of the light-emitting layer 11 away from the blocking layer 1. In operation, the display element according to the embodiment of the disclosure emits light so that the light reaches a finger, and is reflected by a fingerprint on the finger, and the reflected light can be propagated to the fingerprint sensor 2 through the first via-hole of the light-shielding layer 3, and the fingerprint sensor 2 can recognize the fingerprint. In this process, a part of the light emitted by the light-emitting layer 11 is reflected by the cathode layer 10, and this reflected part of the light can be propagated to the antireflection coating 13, and exit the display element through the antireflection coating 13.

The antireflection coating 13 is additionally arranged in the display element fabricated using the fabricating method according to the embodiment of the disclosure, and the stray light reflected by the cathode layer 10 can be transmitted through the antireflection coating 13. It shall be noted that while the fingerprint recognizing sensor is recognizing the fingerprint, on one hand, the stray light reflected by the cathode layer 10 can exit the display element through the antireflection coating, so the luminance of the display element can be improved to thereby improve the intensity of the light reaching the finger, and the intensity of the light reflected by the fingerprint so as to enhance the signal of the fingerprint sensor 2, and to improve the accuracy of recognizing the fingerprint; and on the other hand, the stray light, reflected by the cathode layer 10, reaching the fingerprint sensor 2 can be greatly alleviated due to the effect of the antireflection coating to thereby alleviate the recognition of the fingerprint from being affected by the noisy stray light so as to improve the recognition success ratio. As can be apparent from the description, the accuracy of recognizing the fingerprint by the display element according to the embodiment of the disclosure will be high.

Further to the technical solution above, the fabricating method according to the embodiment of the disclosure further includes the steps of: forming the gate insulating layer 4 on the light-shielding layer 3; forming the gate 5 on the gate insulating layer 4; forming the interlayer insulating layer 6 on the gate 5; forming the source-drain electrode layer 7 on the interlayer insulating layer; and forming the planarization layer 8 on the source-drain electrode layer 7.

It shall be noted that the middle layer is the structure including the various layers in the related art, and can be modified as needed.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display element, comprising:
   a blocking layer;
   a fingerprint sensor on one side of the blocking layer;
   a light-shielding layer on a side of the blocking layer away from the fingerprint sensor, wherein the light-shielding layer comprises a first via-hole, and an orthographic projection of the fingerprint sensor on the blocking layer lies within an orthographic projection of the light-shielding layer on the blocking layer;
   a middle layer on a side of the light-shielding layer away from the blocking layer;
   a pixel definition layer on a side of the middle layer away from the blocking layer, wherein the pixel definition layer comprises a second via-hole in which a cathode layer on a side of the middle layer away from the blocking layer and a light-emitting layer on a side of the cathode away from the blocking layer are arranged;
   an antireflection coating on a side of the pixel definition layer away from the blocking layer; and
   an anode layer on a side of the light-emitting layer away from the blocking layer;
   wherein at least a part of an orthographic projection of the antireflection coating on the blocking layer lies between an orthographic projection of the cathode layer on the blocking layer and the orthographic projection of the light-shielding layer on the blocking layer.

2. The display element according to claim 1, wherein the antireflection coating comprises a plurality of sub-layers stacked in a direction from the fingerprint sensor to the blocking layer.

3. The display element according to claim 2, wherein a thickness of the antireflection coating is one fourth of a wavelength of light which is transmitted therethrough.

4. The display element according to claim 1, wherein the antireflection coating is made of a material at least comprising one of MgF, TiO, or SiO.

5. The display element according to claim 1, wherein the middle layer comprises:
   a gate insulating layer on the side of the light-shielding layer away from the blocking layer;
   a gate on a side of the gate insulating layer away from the blocking layer;
   an interlayer insulating layer on a side of the gate away from the blocking layer;
   a source-drain electrode layer on a side of the interlayer insulating layer away from the blocking layer; and
   a planarization layer on a side of the source-drain electrode layer away from the blocking layer.

6. A display device, comprising the display element according to claim 1.

7. A method for fabricating the display element according to claim 1, comprising:
   arranging a fingerprint on one side of a blocking layer;
   forming a light-shielding layer on a side of the blocking layer away from the fingerprint sensor, forming a first via-hole in the light-shielding layer by hole-etching, and patterning the light-shielding layer so that an orthographic projection of the fingerprint sensor on the blocking layer lies within an orthographic projection of the light-shielding layer on the blocking layer;
   forming a middle layer on the light-shielding layer;
   forming a pixel definition layer on the middle layer;
   depositing an antireflection coating on the pixel definition layer by physical vapor deposition or chemical vapor deposition, and patterning the antireflection coating;
   forming a second via-hole in the pixel definition layer by hole-etching;
   forming a cathode layer and a light-emitting layer in the second via-hole; and
   forming an anode layer on the light-emitting layer.

8. The method according to claim 7, further comprising:
   forming a gate insulating layer on the light-shielding layer;

forming a gate on the gate insulating layer;
forming an interlayer insulating layer on the gate;
forming a source-drain electrode layer on the interlayer insulating layer; and
forming a planarization layer on the source-drain electrode layer.

* * * * *